(12) United States Patent
Zhang

(10) Patent No.: US 6,549,075 B1
(45) Date of Patent: Apr. 15, 2003

(54) METHOD OF CONFIGURING A SWITCH NETWORK FOR PROGRAMMABLE GAIN AMPLIFIERS

(75) Inventor: Weibiao Zhang, Plano, TX (US)

(73) Assignee: Texas Insruments Incorporated, Dallas, TX (US)

( * ) Notice: Subject to any disclaimer, the term of this patent is extended or adjusted under 35 U.S.C. 154(b) by 0 days.

(21) Appl. No.: 10/125,760

(22) Filed: Apr. 18, 2002

(51) Int. Cl.[7] .................................................. H03C 3/20
(52) U.S. Cl. ........................................ 330/282; 330/284
(58) Field of Search .......................... 330/86, 282, 284, 330/144

(56) References Cited

U.S. PATENT DOCUMENTS 4,292,596 A * 9/1981 Ishizuka et al. ............... 330/86
6,310,518 B1 * 10/2001 Swanson ..................... 330/282

* cited by examiner

*Primary Examiner*—Steven J. Mottola
(74) *Attorney, Agent, or Firm*—Pedro P. Hernandez; W. James Brady, III; Frederick J. Telecky, Jr.

(57) ABSTRACT

A method of configuring a switch-network to implement programmable gain devices such as Programmable Gain Amplifiers (PGAs). The method provides high-accuracy and low-distortion with small area requirements and less sensitivity to process and temperature variations when compared with traditional programmable gain architectures where the gain is determined by a ratio between one or more fixed resistors and one or more programmable resistors.

12 Claims, 3 Drawing Sheets

METHOD OF CONFIGURING A SWITCH NETWORK FOR PROGRAMMABLE GAIN AMPLIFIERS

BACKGROUND OF THE INVENTION

1. Field of the Invention

This invention relates generally to programmable gain amplifiers (PGAs), and more particularly, to a method of configuring a switch network associated with a PGA to minimize errors caused by the switch resistance.

2. Description of the Prior Art

Numerous PGA architectures have been implemented to accommodate various applications. A general PGA architecture 100 as shown in FIG. 1 includes an amplifier 102, input resistor R1, feedback resistor R2 and n-bit decoder 104. For simplicity, only the single-ended version is described. The decoder 104 generates the signals necessary to switch in proper valued resistors R1 and R2. If the error caused by the finite amplifier open-loop gain is neglected, the gain of the PGA 100 can be represented by R2/R1. Either R1 or R2 or both can be changed depending on the applications. For multiple gains, a network of switches and resistors must be introduced to select the proper value of resistors R1 and R2 for a specific gain. If resistors R1 and R2 both can be changed, a moving-tap structure can be used as shown in FIG. 2.

FIG. 2 is a schematic diagram illustrating a moving-tap PGA 200 that is known in the art. Only one switch (S1, S2, S3 . . . ) is switched ON for one gain setup. Assume for example, only switch Si is ON ($1 \leq i \leq m$), and let R1=Rtap1+Rtap2+ . . . Rtapi, 2=Rtapi$_{+1}$+ . . . +Rtapm. The gain is determined by R2/R1. The switch resistance is not part of the input resistance or feedback resistance. This is nice, but not all applications can be implemented in this way. Many applications require resistor R1 or resistor R2 to be fixed. If, for example, the input resistor R1 is fixed, the feedback resistor R2 then needs to be programmable. The architecture shown in FIG. 3 is a common choice for this scenario.

FIG. 3 is a schematic diagram illustrating a common PGA structure 300 having a fixed input resistor R1. In FIG. 3, the switches S1, S2, . . . , Sm are part of the feedback resistor; and variable voltage signals across the switches (S1, S2 . . . Sm) are common during normal operation. As can be seen from FIG. 3, neglecting the finite gain of the amplifier 102, the PGA 300 gain is then represented by equation 1, where i is the index of gain steps, Gain is the ith gain, and Rsi is the switch resistance of switch Si.

$$Gain_i = \frac{R2_i + R_{si}}{R1} \quad (1)$$

Popular CMOS switches have varied ON-resistances depending on the drain-source voltages. The variance causes gain error and distortion; so in practical implementations, the ON-resistance is made as small as possible. For example, to achieve a PGA gain of 0.1 (−20 dB) with resistor R1=10K, then the feedback resistor R2 need to be less than 1000 Ohms. A switch resistance of 2% or less then necessitates that the switch resistance be less than 20 Ohms. This will require a CMOS switch W/L ratio in the order of several hundred. If there are many gain steps like this in one PGA, many big switches will be needed, and this will consume extensive die area. Using multiple-stage PGA structure can significantly reduce the number of switches.

FIG. 4 shows a two-stage PGA 400, in which the first stage 402 has p coarse gain steps and the second stage 404 has q fine steps to construct total of p*q gain steps (wherein p and q are integers greater than or equal to 2). Comparing PGA 400 with a one stage PGA, the number of total switches needed for two-stage PGA is reduced from p*q to p+q. The two-stage PGA 400 reduced the number of switches from p*q to p+q. Although the reduction is substantial, reducing the switch sizes and die area is still a remaining problem for the gain steps that require very big switches and very small switch resistances. In view of the foregoing, it would be desirable and advantageous to provide a method of configuring a switch-network to implement Programmable Gain Amplifiers (PGAs) to provide high-accuracy and low-distortion with smaller area and less sensitivity to process and temperature variations when compared with traditional PGA architectures.

SUMMARY OF THE INVENTION

The present invention is directed to a method of configuring a switch network associated with an analog device or mixed-signal device such as a programmable gain amplifier that employs a switch network to determine a ratio between one or more fixed resistors and one or more programmable resistors to minimize errors caused by the switch resistance. Multi-step differential PGA configurations can also be easily obtained in accordance with different embodiments of the present invention. The method configures the switch network such that the switch resistance is a portion of a bigger resistor instead of a smaller resistor to ensure that errors caused by the switch resistance are smaller. The method allows use of smaller switches to maintain a constant error level. This method addresses device gain setups that require big switches to maintain small distortion, wherein the area of the switches is also big; and the gains are sensitive to the layout, process and temperature variations associated with the switches.

In one aspect of the invention, a programmable switch network is implemented within a programmable gain device such that the layout area associated with the switches is minimized.

In another aspect of the invention, a programmable switch network associated with a programmable gain device is implemented to provide a device gain that is insensitive to the layout, process and temperature variations associated with the switches.

One embodiment of the invention is directed to a method of configuring a switch network, the method comprising the steps of providing a variable gain circuit having a switch network that is configurable to control a ratio between at least one fixed resistor and at least one programmable resistor; comparing the resistance of the at least one fixed resistor with the resistance of the at least one programmable resistor for a desired circuit gain; and configuring the switch network such that any switch that is in a DC current path when activated to implement the desired circuit gain is activated such that the DC current path switch resistance combines solely with the at least one resistor having the larger resistance value, and further such that the DC current path switch resistance of any switch that is in a DC current path when activated to implement the desired circuit gain is activated such that the DC current path switch resistance divides equally among the at least one fixed resistor and the at least one programmable resistor when the resistance of the at least one fixed resistor is equal to the resistance of the at least one programmable resistor to implement the desired circuit gain.

Another embodiment of the invention is directed to a method of configuring a switch network comprising providing a variable gain device having a switch network that is programmable to control a ratio between a fixed resistance and a programmable resistance to vary the gain, and programming the switch network such that any switch that is in a DC current path when activated to implement a desired gain is activated such that the DC current path switch resistance combines solely with the largest resistance value selected from among the fixed resistance and the programmable resistance, and further such that the DC current path switch resistance of any plurality of switches that are in a DC current path when activated to implement the desired circuit gain are activated such that the DC current path switch resistance divides equally among the fixed resistance and the programmable resistance when the fixed resistance is equal to the programmable resistance to implement the desired circuit gain.

Still another embodiment of the invention is directed to a method of configuring a switch network within a programmable gain device having a switch network that is programmable to control a ratio between a fixed resistance and a programmable resistance to vary the gain, the method comprising programming the switch network such that at least one switch is in a DC current path when activated to implement a desired gain such that the at least one switch resistance combines solely with the largest value of resistance selected from among the fixed resistance and the programmable resistance when the fixed resistance and the programmable resistance are not equal, and further such that the at least one switch resistance divides equally among the fixed resistance and the programmable resistance when the fixed resistance is equal to the programmable resistance to implement the desired circuit gain.

BRIEF DESCRIPTION OF THE DRAWINGS

Other aspects, features and advantages of the present invention will be readily appreciated, as the invention becomes better understood by reference to the following detailed description, when considered in connection with the accompanying drawing FIGURES wherein.

While the above-identified drawing FIGURES set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

In addition to the multiple-stage PGA structure 400 discussed herein before, another good way to reduce switch sizes is to assign the switches according to the PGA gain value. The idea is to let the switch resistance always be part of either the feedback resistance or the input resistance whichever is bigger; thus, the impact to the PGA gain due to the switch resistance variations is smaller.

Figure 5:
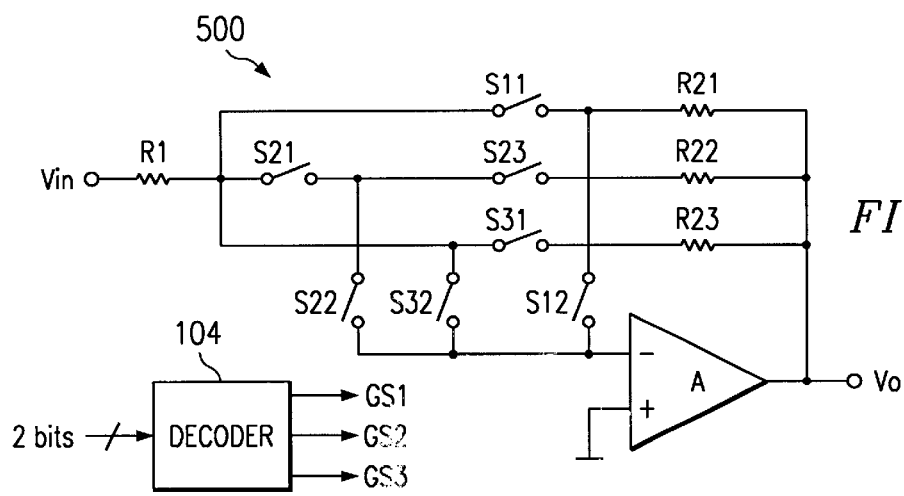
FIG. 5 is a schematic diagram illustrating a flexibly configured switch network architecture within a PGA according to one embodiment of the present invention.

FIG. 5 is a schematic diagram illustrating a flexibly configured switch network architecture to implement a PGA 500 according to one embodiment of the present invention. If input resistor R1 is fixed, three different gain steps G1, G2, and G3 can be implemented in which G1 is smaller than 1.0, G2 is equal to 1.0, and G3 is bigger than 1.0. The PGA 500 gains are selected by the decoder 104 outputs GS1, GS2, and GS3. A switch is OFF unless it is selected to be ON. When GSi=1 (logic high), i. $\in$ [1, 3], all the switches SiX (X $\in$ [1, 3]) are ON if they exist in FIG. 5, while all other switches are OFF. Table 1 lists the gain options, the corresponding switch settings, decoder outputs and the gain formulae.

TABLE 1

Control table for different gain steps of PGA 500

| Gain | ON switches | Decoder outputs | Gain formula |
| --- | --- | --- | --- |
| G1 (<1) | S11, S12 | Only G1 = '1' | $G1 = \dfrac{R21}{R1 + Rs11}$ |
| G2 (=1) | S21, S22, S23 | Only GS2 = '1' | $G2 = \dfrac{R22 + Rs23}{R1 + Rs21}$ |
| G3 (>1) | S31, S32 | Only GS3 = '1' | $G3 = \dfrac{R23 + Rs31}{R1}$ |

Figure 1:
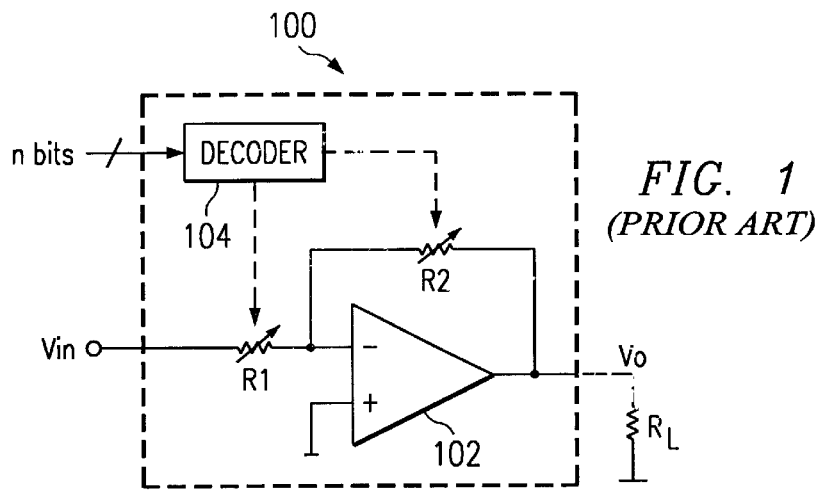
FIG. 1 is a schematic diagram illustrating a general programmable gain amplifier (PGA) that is known in the art.
Figure 2:
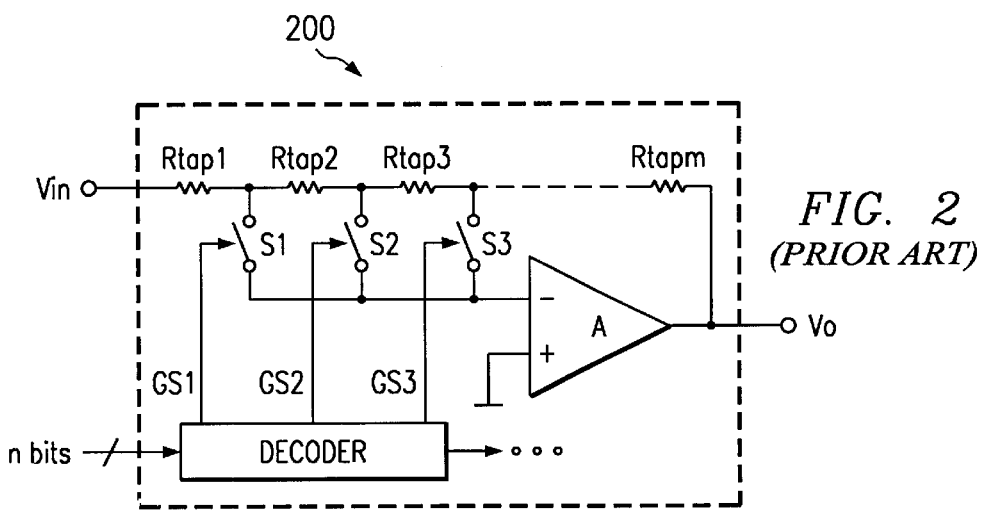
FIG. 2 is a schematic diagram illustrating a moving-tap PGA that is known in the art.
Figure 3:
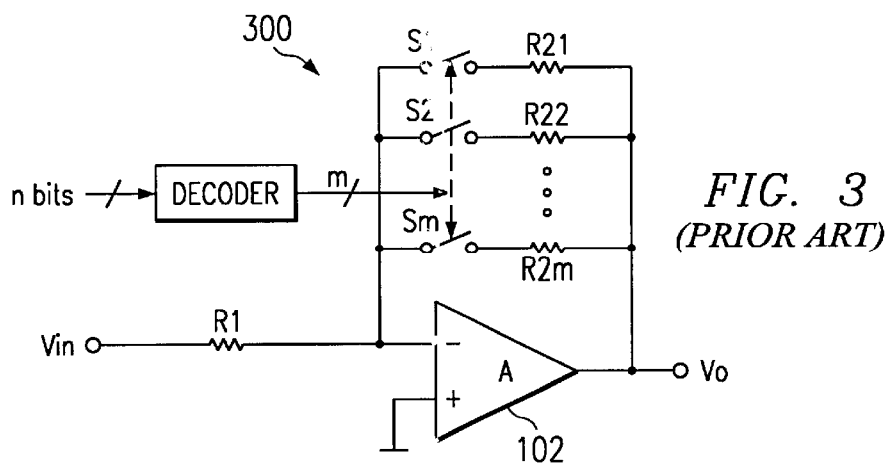
FIG. 3 is a schematic diagram illustrating a common PGA structure having a fixed input resistor.
Figure 4:
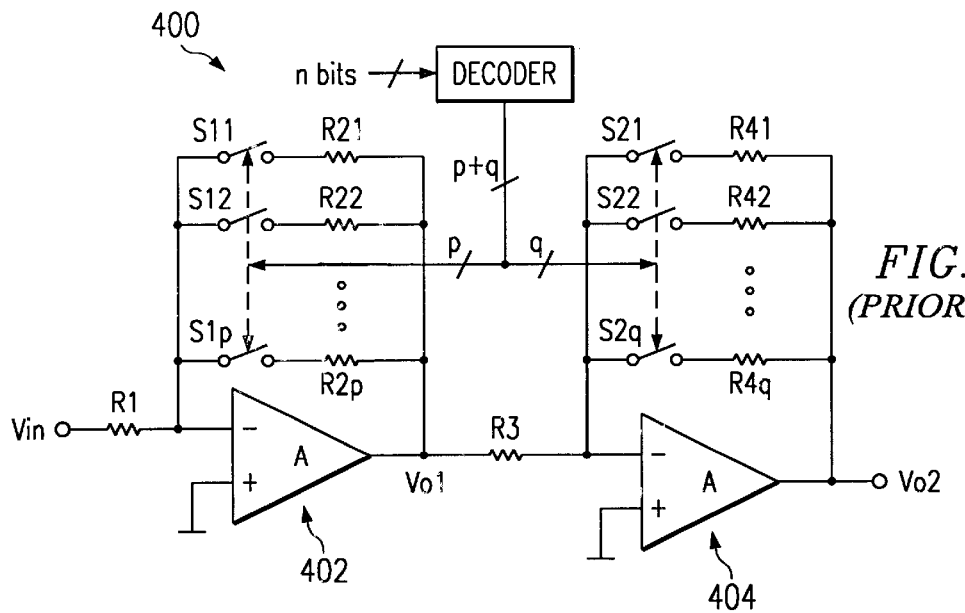
FIG. 4 is a schematic diagram illustrating a two-stage PGA structure that is known in the art.

The switch resistance is generally designed to be much less than the normal resistor R1 and R2 values. For the first case where G1<1, resistor R21 is practically less than R1; then the switch resistance Rs11 is a smaller fraction of resistor R1 than that of resistor R2. So using the architecture shown in FIG. 5, the switch resistance Rs11 would cause smaller gain error and distortion than the traditional architecture shown in FIG. 3. A simple example is now described to more clearly exemplify the improvement. Assume for example, the gain G1=0.1 (−20 dB), and input resistor R1 is 10 K$\Omega$, using the architecture shown in FIG. 3 and equation (1). Then R21+Rs1=1 K$\Omega$; and assuming Rs1 is 2% of the R21, and Rs1$\cong$19.6 $\Omega$, then R21$\cong$980.4 $\Omega$. Using the new architecture depicted in FIG. 5, and assuming use of the same sized switch, then Rs11=19.6 $\Omega$, and R21=1001.96 $\Omega$. Assuming further that there is +50% resistance change to the switches due to various factors, the relative gain error for the architecture shown in FIG. 3 is: (Rs1*1.5+980.4)/(Rs1+980.4)−1=0.98%, while the relative gain error for the architecture shown in FIG. 5 is: (R1+Rs11)/(R1+Rs11*1.5)−2<<−0.098%. Therefore, to maintain the same gain error associated with the architecture shown in FIG. 3, the architecture shown in FIG. 5 allows smaller sized switches with bigger resistance. Assuming further that the 0.98% gain error is to be maintained for the architecture shown in FIG. 5; then the following equations hold: (R1+Rs11)/(R1+Rs11*1.5)=1−0.98%. This gives a resistance for $Rs11 \approx 201.94\Omega$. This is more than 10 times the value of $Rs1=19.6\Omega$. The switch size of S11 can therefore be $1/10^{th}$ the size of switch S1. When using the architecture shown in FIG. 5, the feedback resistor R21 is a little bigger than that required using the architecture shown in FIG. 3; and an additional switch S12 is needed. But importantly, since the switch resistance does not impact the PGA gain, it can be a minimally sized switch. The reduction in area caused by the change from S1 to S11 is far greater than the increase in area associated with R21 and S12. The total area required by the PGA is therefore reduced Regarding the second case shown in Table 1 (G2=1), switch S21 and switch S23 must be the same size, and R1=R22. In practice, the switch resistance needs to be much less than R1 and R22 in order to make the gain insensitive to any variance of switch resistances and to ensure low-distortion.

Regarding the third case shown in Table 1 (G3>1), R23 is practically bigger than R1, and the switch resistance Rs31 is a smaller fraction of R23 than that of R1. Placing it as part of the feedback resistor therefore is better than placing it as part of the input resistor. Both architectures (shown in FIGS. 3 and 5) work the same in this case.

Switches S12, S22, and S32 can be minimally sized switches since there is no DC current flowing through these switches; and the resistance associated with these switches does not impact the PGA gains. The switch network shown in FIG. 5 can be easily tailored to satisfy various PGA applications with any number of gain steps.

Figure 6:
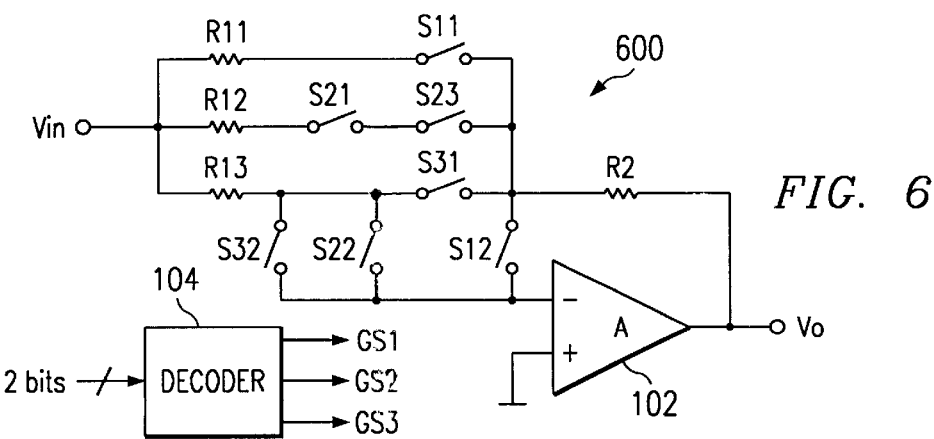
FIG. 6 is a schematic diagram illustrating a flexibly configured switch network architecture within a PGA having a fixed feedback resistor according to one embodiment of the present invention.

FIG. 6 is a schematic diagram illustrating a flexibly configured switch network architecture associated with a PGA 600 having a fixed feedback resistor according to one embodiment of the present invention. Feedback resistor R2 has a fixed value; and three gains (G1<1, G2=1, G3>1) can be easily implemented. The PGA 600 gains are selected by the decoder 104 outputs GS1–GS3 as stated herein before. A switch is OFF unless it is selected to be ON. When GSi='1' (logic high), $i \in [1,3]$, all the switches SiX (X∈ [1, 3]) are ON if they exist in FIG. 6, while all other switches are OFF. Table 2 lists the gain options, the corresponding switch settings, decoder outputs and the gain formulae associated with the PGA 600 shown in FIG. 6.

TABLE 2

Control table for different gain steps for PGA 600

| Gain | ON switches | Decoder outputs | Gain formula |
|---|---|---|---|
| G1 (<1) | S11, S12 | Only GS1 = '1' | $G1 = \dfrac{R2}{R11 + Rs11}$ |
| G2 (=1) | S21, S22, S23 | Only GS2 = '1' | $G2 = \dfrac{R2 + Rs23}{R12 + Rs21}$ |
| G3 (>1) | S31, S32 | Only GS3 = '1' | $G3 = \dfrac{R2 + Rs31}{R13}$ |

Figure 7:
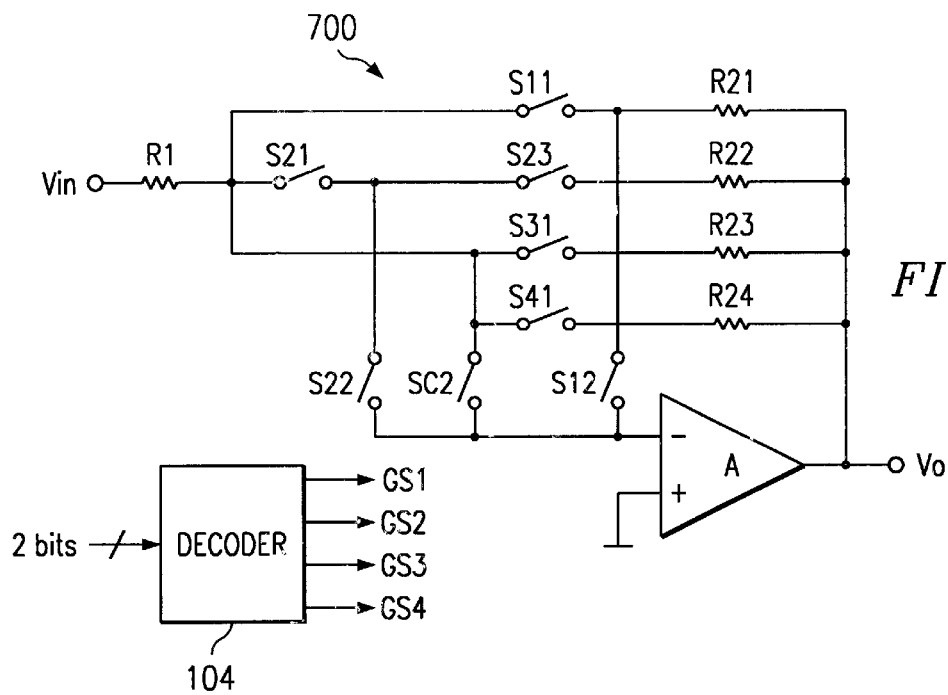
FIG. 7 is a schematic diagram illustrating a flexibly configured switch network architecture within a PGA having a fixed input resistor according to one embodiment of the present invention.

When the input resistor R1 is fixed, the switch network can be simplified for those gain-setups eat bigger than 1. Some switches that connect the amplifier's 102 input node to the internal nodes of the switch network can be merged. FIG. 7 illustrates this idea for a PGA 700 with four gains: G1<1, G2=1, G3>1 and G4>1. The gains are selected by the decoder 104 outputs GS1–GS4. A switch is OFF unless it is selected to be ON. When GSi='1' (logic high), $i \in [1, 4]$, all the switches SiX (X ∈ [1, 3]) are ON if they exist in FIG. 7. Switch SC2 is ON only when GS3='1' or GS4='1'. Table 3 lists the gain options, the corresponding ON switches, decoder outputs and the formulae associated with PGA 700.

TABLE 3

Control table for different gain steps of PGA 700

| Gain | ON switches | Decoder outputs | Gain formula |
|---|---|---|---|
| G1 (<1) | S11, S12 | Only GS1 = '1' | $G1 = \dfrac{R21}{R1 + Rs11}$ |
| G2 (=1) | S21, S22, S23 | Only GS2 = '1' | $G2 = \dfrac{R22 + Rs23}{R1 + Rs21}$ |
| G3 (>1) | S31, SC2 | Only GS3 = '1' | $G3 = \dfrac{R23 + Rs31}{R1}$ |
| G4 (>1) | S41, SC2 | Only GS4 = '1' | $G4 = \dfrac{R24 + Rs41}{R1}$ |

If all the gains are bigger than 1, the switch SC2 can be removed, resulting a network like that shown in FIG. 3. For other cases that have more than 4 gain setups, similar modifications can be implemented to simplify the network. Similarly when the feedback resistor R2 is fixed, the switch network can be simplified for those gain setups smaller than 1.

Figure 8:
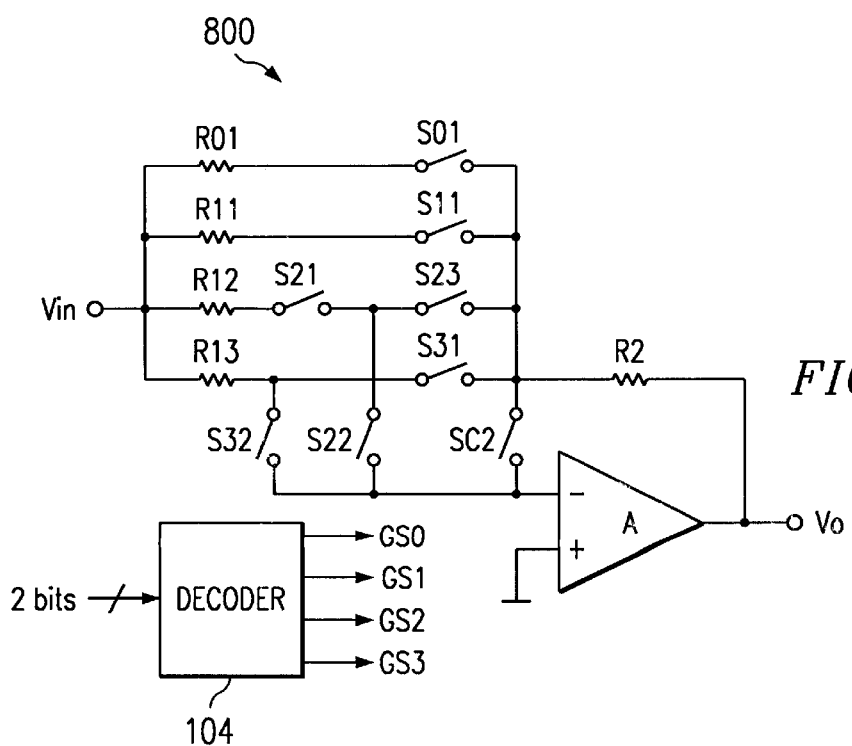
FIG. 8 is a schematic diagram illustrating a flexibly configured switch network architecture within a PGA having a fixed feedback resistor according to one embodiment of the present invention.

FIG. 8 illustrates a PGA 800 with four gains: G0<1, G1<1, G2=2, and G3>1. Specifically, PGA 800 results in a structure simplification for gains smaller than 1 when the feedback resistor R2 is fixed. The gains are selected by the decoder 104 outputs GS0–GS3. A switch is OFF unless it is selected to be ON. When GSi='1' (logic high), $i \in [0,3]$, all the switches SiX (X ∈ [1, 3]) are ON if they exist in FIG. 8. Switch SC2 is ON only when GS0='1' or GS1='1'. Table 4 lists the gain options, the corresponding ON switches, decoder outputs and the formulae associated with PGA 800.

TABLE 4

Control table for gain steps of PGA 800

| Gain | ON switches | Decoder outputs | Gain formula |
|---|---|---|---|
| G0 (<1) | S01, SC2 | Only GS0 = '1' | $G0 = \dfrac{R2}{R01 + Rs01}$ |
| G1 (<1) | S11, SC2 | Only GS1 = '1' | $G1 = \dfrac{R2}{R11 + Rs11}$ |
| G2 (=1) | S21, S22, S23 | Only GS2 = '1' | $G2 = \dfrac{R2 + Rs23}{R12 + Rs21}$ |
| G3 (>1) | S31, S32 | Only GS3 = '1' | $G3 = \dfrac{R2 + Rs31}{R13}$ |

Although all of the FIGURES referenced herein above use single ended and single stage configuration, the present invention is not so limited, and it shall be understood that multi-step differential PGA configurations can also be easily obtained in accordance with different embodiments of the present invention. Furthermore, although the idea of the flexible configured switch-network is only discussed under the PGA scenario, it can be applied to other analog and mixed signal circuit blocks, wherever a gain determined by the ratio between a fixed resistance and a programmable resistance is needed.

In summary explanation, switch resistances and sizes are optimized by configuring switches to be part of a relatively bigger resistor in the network for programmable gain amplifiers or other devices where the gain is determined by a ratio between one or more fixed resistors and one or more programmable resistors. The flexibly configured switch-network allows more insensitivity of the designed-in gain to the variations of the switch resistance(s) due to voltage changes, process and temperature variations, and the like.

In view of the above, it can be seen the present invention presents a significant advancement in the art of programmable gain amplifier structures. Further, it should be apparent that the present invention also represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A method of configuring a switch network, the method comprising the steps of:

providing a variable gain circuit having a switch network that is configurable to control a ratio between at least one fixed resistor and at least one programmable resistor;

comparing the ratio of the resistance of the at least one fixed resistor and the resistance of the at least one programmable resistor for a desired circuit gain; and configuring the switch network such that any switch that is in a DC current path when activated to implement the desired circuit gain is activated such that the DC current path switch resistance combines solely with the at least one resistor having the larger resistance value, and further such that the DC current path switch resistance of any switch that is in a DC current path when activated to implement the desired circuit gain is activated such that the DC current path switch resistance divides equally among the at least one fixed resistor and the at least one programmable resistor when the resistance of the at least one fixed resistor is equal to the resistance of the at least one programmable resistor to implement the desired circuit gain.

2. The method according to claim 1 wherein the step of configuring the switch network comprises generating a decoder signal that activates only switches within the switch network necessary to provide the desired circuit gain.

3. The method according to claim 1 wherein the step of providing a variable gain circuit having a switch network that is configurable to control a ratio between at least one fixed resistor and at least one programmable resistor comprises providing a programmable gain amplifier having a fixed input resistance and a programmable feedback resistance.

4. The method according to claim 1 wherein the step of providing a variable gain circuit having a switch network that is configurable to control a ratio between at least one fixed resistor and at least one programmable resistor comprises providing a programmable gain amplifier having a fixed feedback resistance and a programmable input resistance.

5. A method of configuring a switch network comprising providing a variable gain device having a switch network that is programmable to control a ratio between a fixed resistance and a programmable resistance to vary the gain, and programming the switch network such that any switch that is in a DC current path when activated to implement a desired gain is activated such that the DC current path switch resistance combines solely with the largest resistance value selected from among the fixed resistance and the programmable resistance, and further such that the DC current path switch resistance of any plurality of switches that are in a DC current path when activated to implement the desired circuit gain are activated such that the DC current path switch resistance divides equally among the fixed resistance and the programmable resistance when the fixed resistance is equal to the programmable resistance to implement the desired circuit gain.

6. The method according to claim 5 wherein programming the switch network comprises generating a decoder signal that activates only switches within the switch network necessary to provide the desired circuit gain.

7. The method according to claim 5 wherein providing a variable gain device having a switch network that is programmable to control a ratio between a fixed resistance and a programmable resistance comprises providing a programmable gain amplifier having a fixed input resistance and a programmable feedback resistance.

8. The method according to claim 5 wherein providing a variable gain device having a switch network that is programmable to control a ratio between a fixed resistance and a programmable resistance comprises providing a programmable gain amplifier having a fixed feedback resistance and a programmable input resistance.

9. A method of configuring a switch network within a programmable gain device having a switch network that is programmable to control a ratio between a fixed resistance and a programmable resistance to vary the gain, the method comprising programming the switch network such that at least one switch is in a DC current path when activated to implement a desired gain such that the at least one switch resistance combines solely with the largest value of resistance selected from among the fixed resistance and the programmable resistance when the fixed resistance and the programmable resistance are not equal, and further such that the at least one switch resistance divides equally among the fixed resistance and the programmable resistance when the fixed resistance is equal to the programmable resistance to implement the desired circuit gain.

10. The method according to claim 9 wherein programming the switch network comprises generating a decoder signal that activates only switches within the switch network necessary to provide the desired circuit gain.

11. The method according to claim 9 wherein the programmable gain device having a switch network that is programmable to control a ratio between a fixed resistance and a programmable resistance comprises providing a programmable gain amplifier having a fixed input resistance and a programmable feedback resistance.

12. The method according to claim 9 wherein the programmable gain device having a switch network that is programmable to control a ratio between a fixed resistance and a programmable resistance comprises providing a programmable gain amplifier having a fixed feedback resistance and a programmable input resistance.

* * * * *